US012581626B2

(12) United States Patent
Oh et al.

(10) Patent No.: US 12,581,626 B2
(45) Date of Patent: Mar. 17, 2026

(54) DISPLAY DEVICE, FUNCTIONAL LAYER INCLUDED IN DISPLAY DEVICE AND METHOD OF MANUFACTURING DISPLAY DEVICE

(71) Applicant: Samsung Display Co., LTD., Yongin-si (KR)

(72) Inventors: Hyun Joon Oh, Yongin-si (KR); Junhee Son, Yongin-si (KR); Jee-Na Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 210 days.

(21) Appl. No.: 18/224,266

(22) Filed: Jul. 20, 2023

(65) Prior Publication Data

US 2024/0121925 A1 Apr. 11, 2024

(30) Foreign Application Priority Data

Oct. 11, 2022 (KR) ........................ 10-2022-0130035

(51) Int. Cl.
H05K 7/20 (2006.01)
H05K 9/00 (2006.01)

(52) U.S. Cl.
CPC ....... H05K 7/20963 (2013.01); H05K 9/0081 (2013.01)

(58) Field of Classification Search
CPC ........................ H05K 7/20963; H05K 9/0081
See application file for complete search history.

(56) References Cited

U.S. PATENT DOCUMENTS

| | | | | |
|---|---|---|---|---|
| 6,635,343 | B2 * | 10/2003 | Inoue | C09J 7/22 |
| | | | | 428/521 |
| 11,280,558 | B2 | 3/2022 | Lee et al. | |
| 2020/0325952 | A1 * | 10/2020 | Ryu | B32B 17/06 |
| 2022/0097353 | A1 * | 3/2022 | Nakanishi | H05K 9/0096 |
| 2022/0181576 | A1 | 6/2022 | Cha et al. | |

FOREIGN PATENT DOCUMENTS

| | | | | |
|---|---|---|---|---|
| KR | 101668810 | B1 | 10/2016 | |
| KR | 1020180059653 | A | 6/2018 | |
| KR | 1020220080861 | A | 6/2022 | |
| WO | WO-2020239091 | A1 * | 12/2020 | G09F 9/00 |

OTHER PUBLICATIONS

WO-2020239091-A1 English translation (Year: 2020).*

* cited by examiner

*Primary Examiner* — Mukundbhai G Patel
(74) *Attorney, Agent, or Firm* — CANTOR COLBURN LLP

(57) ABSTRACT

A display device includes a display panel which displays an image, and a functional layer disposed below the display panel. The functional layer includes an adhesive layer disposed below the display panel, a first heat dissipation layer disposed below the adhesive layer, a cushion layer disposed below the first heat dissipation layer, and including a heat-conducting particle, and a second heat dissipation layer disposed below the cushion layer.

23 Claims, 16 Drawing Sheets

HDL2

HDL2-11        HDL2-2        HDL2-12

DR1
DR2
DR3

HDL2-11 ⎫
          ⎬ HDL2-1
HDL2-12 ⎭

CPL-C

HDL1
SL1
CL    HDF
SL2
HDL2

EL

HDL1
SL1
CL    HDF
SL2
HDL2

DISPLAY DEVICE, FUNCTIONAL LAYER INCLUDED IN DISPLAY DEVICE AND METHOD OF MANUFACTURING DISPLAY DEVICE

This application claims priority to Korean Patent Application No. 10-2022-0130035, filed on Oct. 11, 2022, and all the benefits accruing therefrom under 35 U.S.C. § 119, the content of which in its entirety is herein incorporated by reference.

BACKGROUND

1. Field

The disclosure herein relates to a display device, a functional layer included in a display device and a method of manufacturing a display device, and more particularly, to a display device having improved heat dissipation characteristics, a functional layer included in a display panel and a method of manufacturing a display device.

2. Description of the Related Art

Display devices such as smartphones, digital cameras, laptop computers, navigation systems, and smart televisions provide an image through a display screen to a user. Display devices may include a display panel which generates an image. In recent years, various display devices are being developed to have higher performance and more reduced size.

SUMMARY

In a display device having high performance and reduced size, electronic components included therein are becoming larger in capacity and higher in integration. Accordingly, much heat is generated from the electronic components of such a display device. Heat generated within the display device may shorten the life span of the product or causes failure or malfunction of the components. Accordingly, studies are being conducted on a solution to dissipate heat generated inside a display device to an outside.

Embodiments of the disclosure provide a display device which has a functional layer having a simplified structure and has an improved heat conductivity to prevent the occurrence of deterioration defects due to heat generated therein, and a functional layer included in the display device.

Embodiments of the disclosure provide a method of manufacturing a display device, the method being capable of forming a functional layer having a simplified structure by minimizing an adhesive layer.

An embodiment of the invention provides a device including: a display panel which displays an image; and a functional layer disposed below the display panel, where the functional layer includes an adhesive layer disposed below the display panel, a first heat dissipation layer disposed below the adhesive layer, a cushion layer disposed below the first heat dissipation layer and including heat-conducting particles, and a second heat dissipation layer disposed below the cushion layer.

In an embodiment, at least one selected from the first heat dissipation layer and the second heat dissipation layer may include an electromagnetic shield material.

In an embodiment, each of the first heat dissipation layer and the second heat dissipation layer may include a heat-dissipating material, where the heat-dissipating material may include at least one selected from a heat-conducting metal, a carbon-based heat-dissipating material, and a heat-conducting polymer.

In an embodiment, the heat-conducting particles each may include at least one selected from a heat-conducting metal, a carbon-based heat-dissipating material, and a ceramic heat-dissipating material, and a combination thereof.

In an embodiment, the cushion layer may have a heat conductivity in a range of about 0.1 watt per meter-Kelvin (W/(m·K)) to about 100 W/(m·K).

In an embodiment, the adhesive layer may have a thickness in a range of about 10 micrometers (μm) to about 50 μm.

In an embodiment, each of the first heat dissipation layer and the second heat dissipation layer may have a thickness in a range of about 10 μm to about 100 μm.

In an embodiment, the cushion layer may have a thickness in a range of about 50 μm to about 200 μm.

In an embodiment, the first heat dissipation layer may be directly disposed below the adhesive layer, the cushion layer may be directly disposed below the first heat dissipation layer, and the second heat dissipation layer may be directly disposed below the cushion layer.

In an embodiment, the cushion layer may include a first surface adjacent to the first heat dissipation layer, and a second surface adjacent to the second heat dissipation layer, and the functional layer may further include a primer layer disposed on at least one selected from the first surface and the second surface.

In an embodiment, the functional layer may further include an additional heat dissipation layer disposed adjacent to at least one selected from the first heat dissipation layer and the second heat dissipation layer, where the additional heat dissipation layer may include a heat-dissipating material different from heat-dissipating materials of the first heat dissipation layer and the second heat dissipation layer.

In an embodiment, the functional layer may further include a shock-absorbing layer disposed below the second heat dissipation layer, where the shock-absorbing layer may include a shock-absorbing material.

In an embodiment, at least one selected from the adhesive layer, the first heat dissipation layer, the cushion layer and the second heat dissipation layer may include a light-blocking material.

In an embodiment, the light-blocking material may include a carbon-based material, a black pigment, or a black dye, where the carbon-based material may include graphene or graphite.

In an embodiment, the adhesive layer may further include a foaming agent or elastic hollow particles.

In an embodiment, the cushion layer may include: skin layers adjacent to the first heat dissipation layer and the second heat dissipation layer; and a central layer disposed between the skin layers, where pores may be defined in the central layer.

In an embodiment, the second heat dissipation layer may include: a first heat dissipation part which, on a plane, overlaps a portion of the cushion layer; and a second heat dissipation part which, on the plane, overlaps the remaining portion of the cushion layer, and includes a material different from a material of the first heat dissipation part.

In an embodiment of the invention, a display device includes: a display panel which displays an image; and a functional layer disposed below the display panel, where the functional layer includes an adhesive layer disposed below the display panel, a first heat dissipation layer directly disposed below the adhesive layer, a cushion layer directly disposed below the first heat dissipation layer, and a second heat dissipation layer disposed below the cushion layer.

In an embodiment, the cushion layer may include at least one selected from a heat-conducting metal, a carbon-based heat-dissipating material, and a ceramic heat-dissipating material, and a combination thereof.

In an embodiment of the invention, a functional layer includes: an adhesive layer including protrusion patterns; a first heat dissipation layer disposed below the adhesive layer; a cushion layer disposed below the first heat dissipation layer, and including heat-conducting particles; and a second heat dissipation layer disposed below the cushion layer.

In an embodiment, the adhesive layer may further include an adhesive base adjacent to the first heat dissipation layer, and the protrusion patterns protrude from an upper portion of the adhesive base in a direction away from the first heat dissipation layer.

In an embodiment of the invention, a method of manufacturing a display device includes: preparing a display panel which displays an image; and forming a functional layer and bonding the functional layer under the display panel. In such an embodiment, the functional layer includes an adhesive layer bonding to a lower portion of the display panel, a first heat dissipation layer disposed below the adhesive layer, a cushion layer disposed below the first heat dissipation layer, and including heat-conducting particles, and a second heat dissipation layer disposed below the cushion layer, the forming of the functional layer including foaming the cushion layer using, as a base layer, at least one selected from the first heat dissipation layer and the second heat dissipation layer.

In an embodiment, in the forming the cushion layer, the cushion may be formed to contact each of the first heat dissipation layer and the second heat dissipation layer, and the forming the functional layer may further include, after the foaming the cushion layer, attaching the adhesive layer on the first heat dissipation layer.

In an embodiment, in the forming the cushion layer, the cushion layer may be formed to contact one of the first heat dissipation layer and the second heat dissipation layer, and the forming the functional layer may further include, after the foaming the cushion layer, attaching the other of the first heat dissipation layer and the second heat dissipation layer to the cushion layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

4

Figure 5:
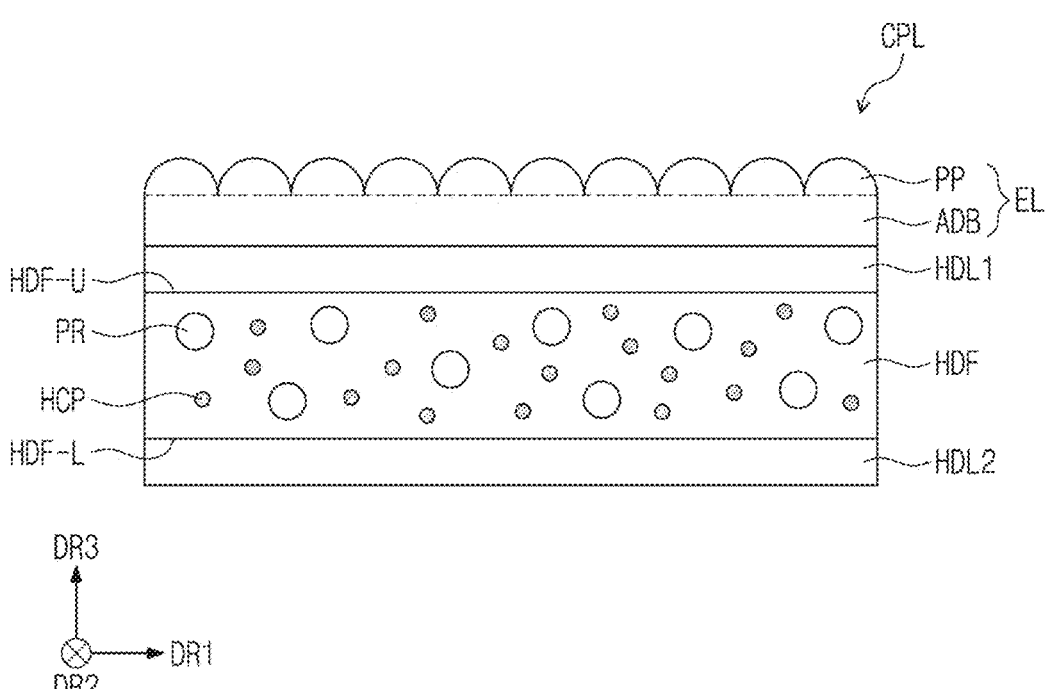
Figure 6A:
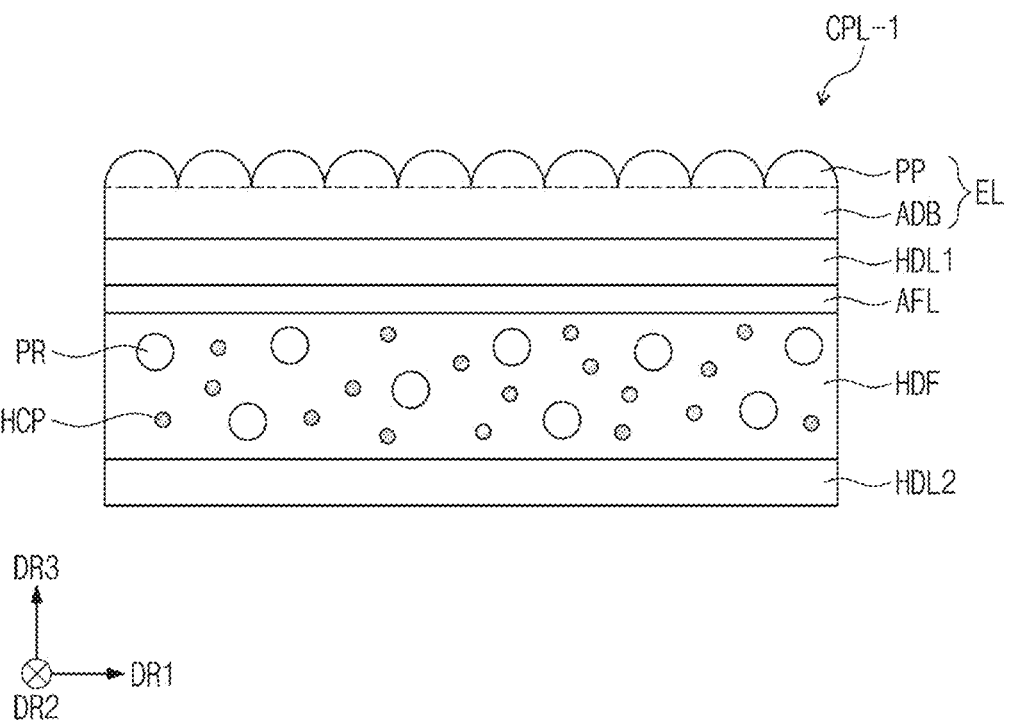
Figure 6B:
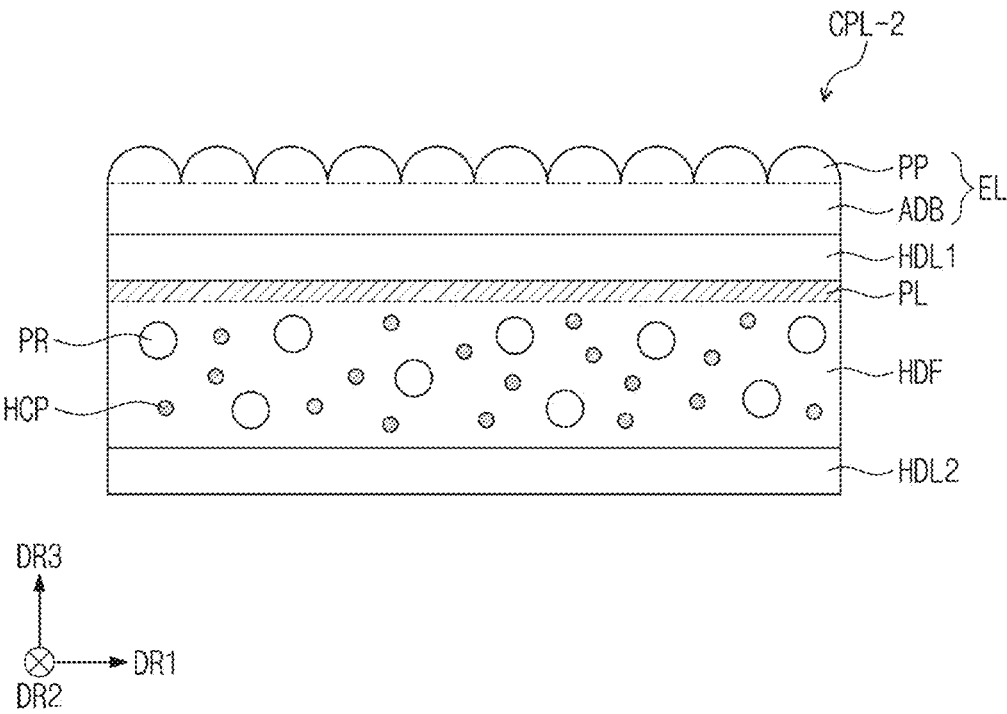
Figure 6C:
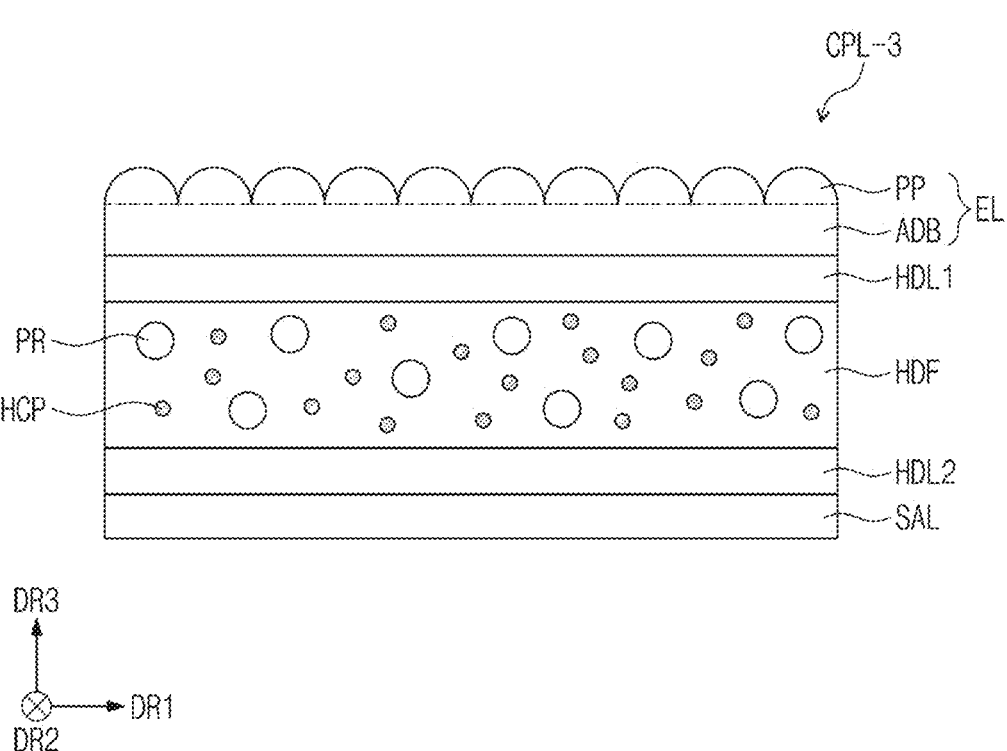
Figure 7:
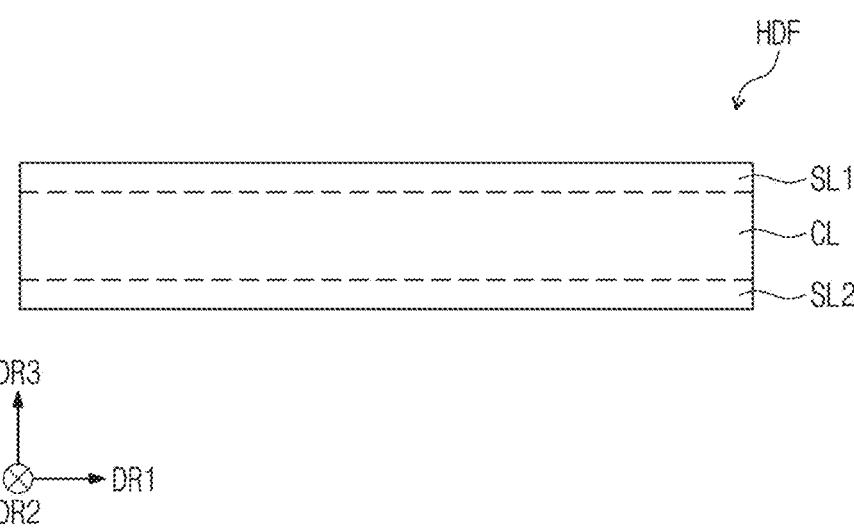
Figure 8:
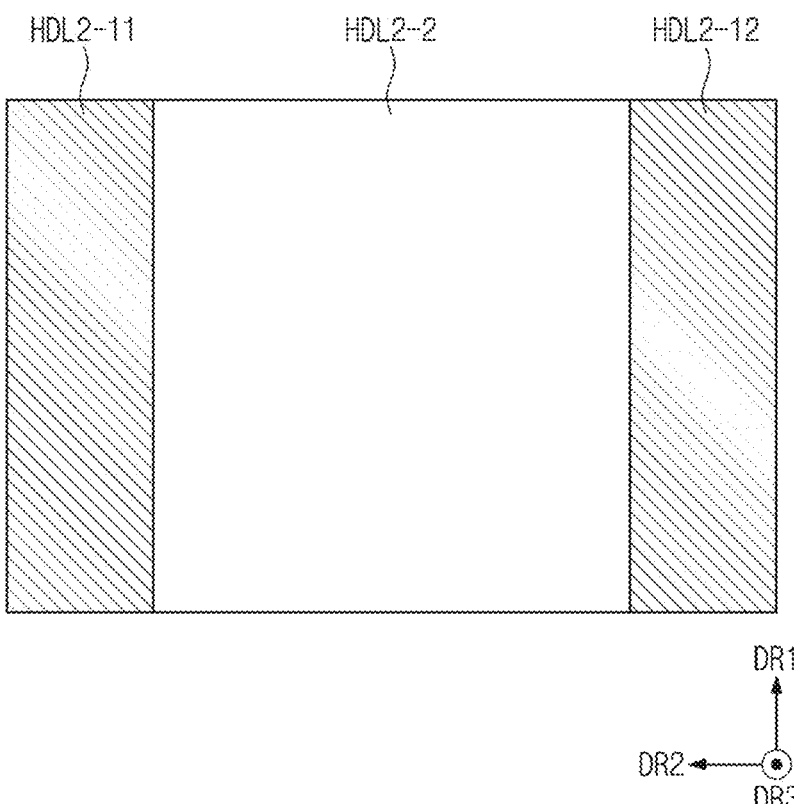
Figure 9A:
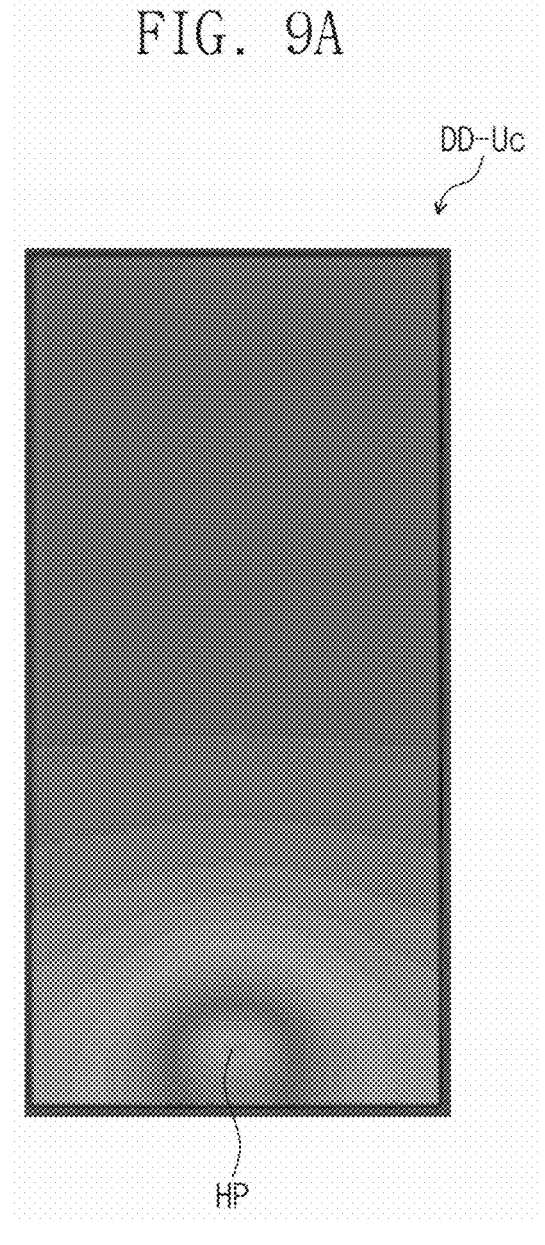
Figure 9B:
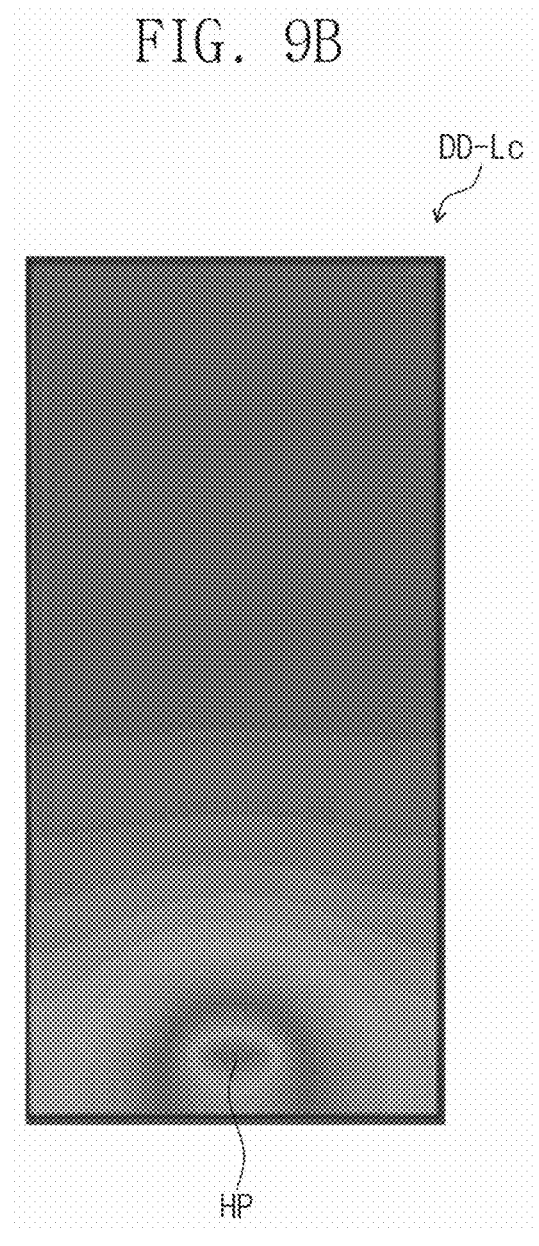
Figure 10A:
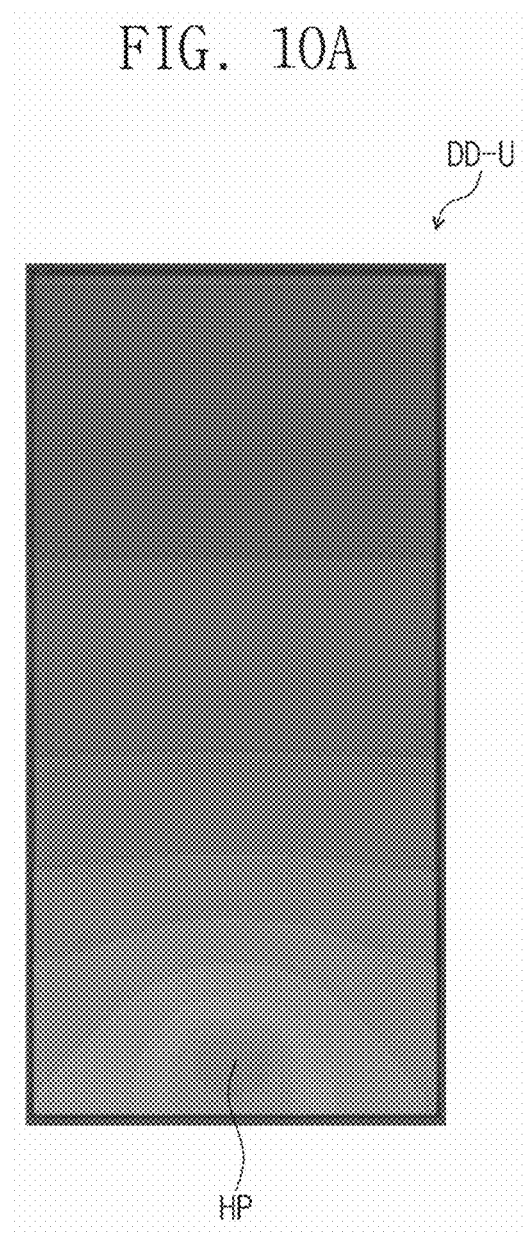
Figure 10B:
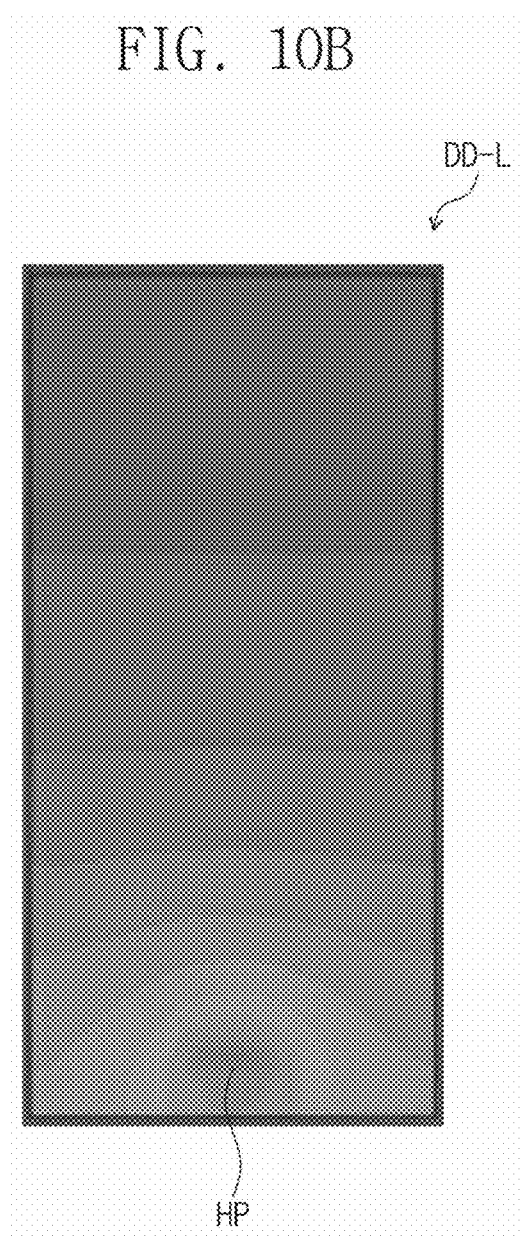
Figure 11:
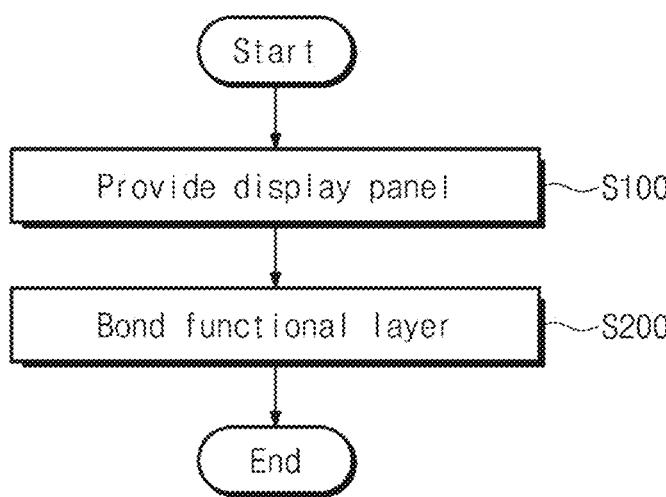

FIG. 5 is a cross-sectional view illustrating a functional layer according to an embodiment of the invention;

FIGS. 6A to 6C each are a cross-sectional view illustrating a functional layer according to an embodiment of the invention;

FIG. 7 is a cross-sectional view illustrating a cushion layer according to an embodiment of the invention;

FIG. 8 is a plan view illustrating a partial configuration included in a functional layer according to an embodiment of the invention;

FIG. 9A and FIG. 9B are captured images showing temperature gradients in a front surface and a rear surface of a display device according to Comparative Example;

FIG. 10A and FIG. 10B are captured images showing temperature gradients in a front surface and a rear surface of a display device according to Example;

FIG. 11 is a flowchart illustrating a method of manufacturing a display device according to an embodiment of the invention; and FIG. 12A, FIG. 12B, FIG. 13A, FIG. 13B, FIG. 14A, and FIG. 14B are cross-sectional views illustrating some operations of a method of manufacturing a display device according to an embodiment of the invention.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on", "connected to" or "coupled to" another element or layer, it can be directly on, connected or coupled to the other element or layer or intervening elements or layers may be present.

Like reference numerals or symbols refer to like elements throughout. The thickness and the ratio and the dimension of the element are exaggerated for effective description of the technical contents.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms, "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or groups thereof.

In this specification, "directly disposed" may mean that there is no intervening layer, film, region, or plate between portions of a layer, film, region, or plate and another portion. For example, "directly disposed" may mean disposing between two layers or two members without using an additional member such as an adhesive member.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within $\pm 30\%$, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1:
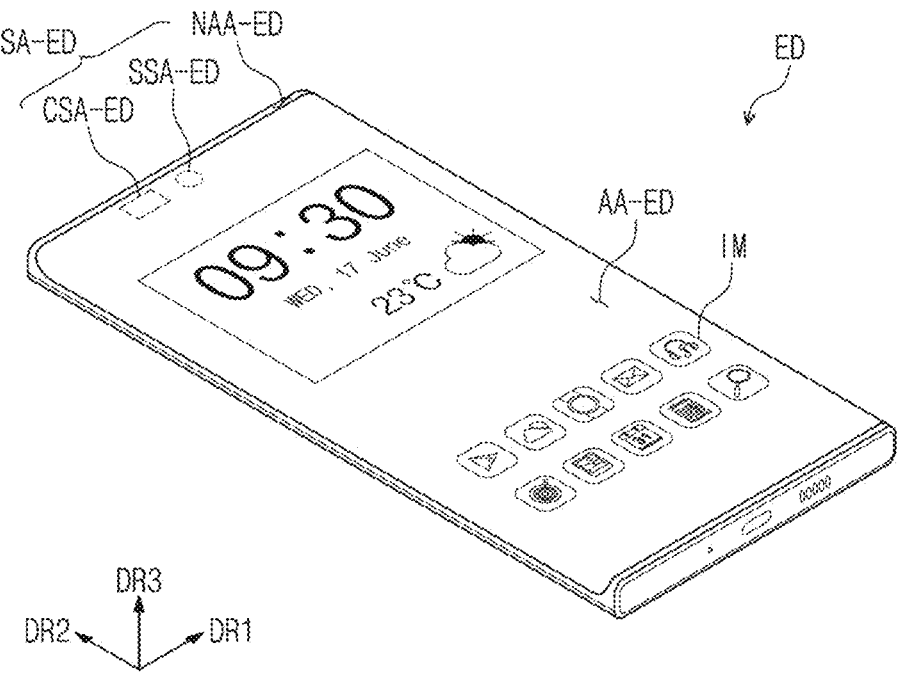
FIG. 1 is a perspective view of an electronic device according to an embodiment of the invention.
Figure 2:
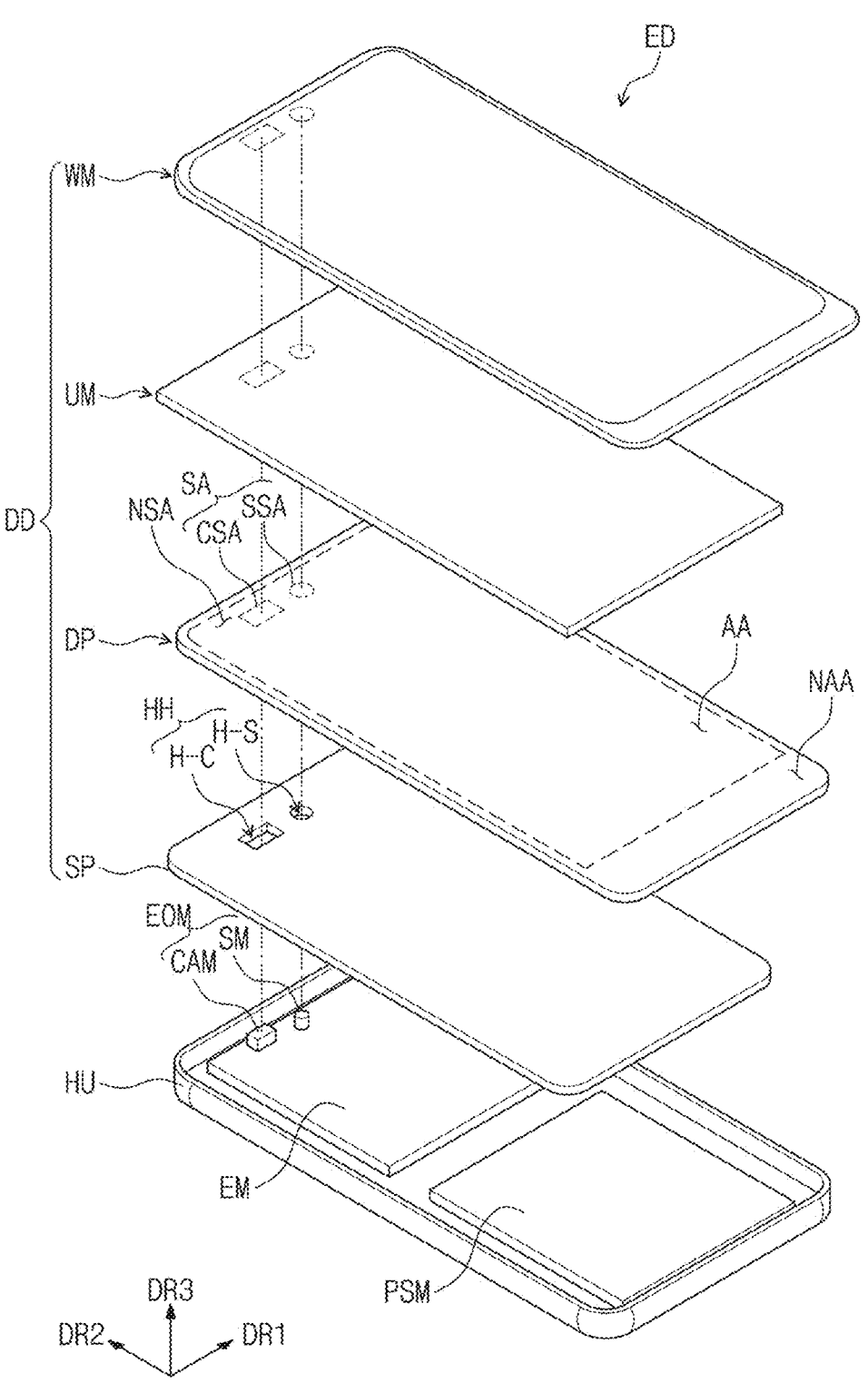
FIG. 2 is an exploded perspective view illustrating an electronic device according to an embodiment of the invention.

FIG. 1 is a perspective view of an electronic device ED according to an embodiment of the invention. FIG. 2 is an exploded perspective view of the electronic device ED according to an embodiment of the invention.

The electronic device ED according to an embodiment may be a device activated in response to electrical signals. In an embodiment, for example, the electronic device ED may be a mobile phone, a tablet computer, a car navigation system, a game console or a wearable device, but is not limited thereto. FIG. 1 illustrates an embodiment where the electronic device ED is a mobile phone.

The electronic device ED may display an image IM through an active region AA-ED defined therein. The active region AA-ED may include a flat surface on a plane defined by a first direction DR1 and a second direction DR2. The active region AA-ED may further include a curved surface bent from at least one side of the flat surface on the plane defined by the first direction DR1 and the second direction DR2. The electronic device ED according to an embodiment, as shown in in FIG. 1, may include two curved surfaces respectively bent from opposing sides of the flat surface in the first direction DR1. However, the shape of the active region AA-ED is not limited thereto. In an alternative embodiment, for example, the active region AA-ED may include only a flat surface, or the active region AA-ED may further include curved surfaces bent from at least two side surfaces of the flat surface, for example, four curved surfaces respectively bent from four side surfaces of the flat surface.

In FIG. 1 and the following drawings, the first direction DR1 to a third direction DR3 are illustrated, and directions respectively indicated by the first direction DR1, the second direction DR2, and the third direction DR3 described herein are relative concepts and may thus be changed into other directions.

In this specification, the first direction DR1 and the second direction DR2 may be orthogonal to each other, and the third direction DR3 may be a direction of a normal line to the plane defined by the first direction DR1 and the second direction DR2. In this specification, the meaning of "on a plane" may indicate when viewed on the plane defined by the first direction DR1 and the second direction DR2 or viewed in the third direction DR3, and the thickness direction may mean the third direction DR3, which is a direction of a normal line to the plane defined by the first direction DR1 and the second direction DR2.

A sensing region SA-ED may be defined in the electronic device ED. In an embodiment, as shown in FIG. 1, the sensing region SA-Ed may include a camera sensing region CSA-ED and a sensor sensing region SSA-ED, but number of sensing regions SA-ED is not limited thereto, and a single sensing region or a plurality of sensing regions SA-ED, for example, three or more sensing regions, may be defined. Also, the sensing region SA-ED is defined in the active region AA-ED and may be a part of the active region AA-ED.

In an embodiment, as show in FIG. 2, an electro-optical module EOM may overlap the sensing region SA-ED. The electro-optical module EOM may receive an external input transmitted through the sensing region SA-ED, or provide an output through the sensing region SA-ED. In an embodiment, for example, a camera module may overlap the camera sensing region CSA-ED, and a sensor module may overlap the sensor sensing region SSA-ED.

The electronic device ED may include the active region AA-ED and a peripheral region NAA-ED adjacent to the active region AA-ED. The active region AA-ED may correspond to a display region AA of a display panel DP which will be described later, and the peripheral region NAA-ED may correspond to a non-display region NAA of the display panel DP.

The peripheral region NAA-ED may be a region that blocks lights or optical signals, and may be a region disposed outside the active region AA-ED, and surrounding the active region AA-ED. In an embodiment, the peripheral region NAA-ED may be disposed on a side surface of the electronic device ED instead of a front surface. In an alternative embodiment, the peripheral region NAA-ED may be omitted.

The electronic device ED according to an embodiment includes the display device DD, a housing HU, and the electro-optical module EOM. The display device DD may include a window WM, an upper member UM, a display panel DP, and a lower member SP.

The display device DD according to an embodiment may include the window WM disposed on the display panel DP. The window WM provides an outer surface of the electronic device ED. The window WM may cover the front surface of the display panel DP, and protect the display panel DP from external shocks and scratches. The window WM may be coupled to the upper member UM through an adhesive layer.

The window WM may include an optically transparent insulating material. In an embodiment, for example, the window WM may include a glass film or a synthetic resin film as a base film. The window WM may have a single-layer or a multi-layer structure. In an embodiment, for example, the window WM may include a plurality of plastic films bonded to each other with an adhesive, or a glass film and a plastic film bonded to each other with an adhesive. The window WM may further include a functional layer such as an anti-fingerprint layer, a phase control layer, and a hard coating layer disposed on a transparent film.

In the display device DD according to an embodiment, the upper member UM may be disposed below the window WM and above a display module DM. The upper member UM may include an anti-reflection layer and an input sensing sensor. The anti-reflection layer lowers the external light reflectance. The input sensing sensor may sense external input of a user. The upper member UM may further include an adhesive layer bonding the anti-reflection layer and the input sensing sensor.

In the display device DD according to an embodiment, the display panel DP may be disposed below the upper member UM. The lower member SP may be disposed below the display panel DP.

The display panel DP may include a display region AA for displaying an image IM and a non-display region NAA adjacent to the display region AA. That is, the front surface of the display panel DP may include the display region AA and the non-display region NAA. The display region AA may be activated in response to electrical signals, and may generate the image IM displayed in the active region AA-ED of the electronic device ED.

The non-display region NAA may be adjacent to the display region AA. The non-display region NAA may surround the display region AA. In the non-display region NAA, a driving circuit or a driving wire for driving the display region AA, various signal lines or pads for providing electrical signals to the display region AA, or an electronic component may be disposed.

The display panel DP may include a first region NSA and a second region SA. The second region SA may be a region overlapping the electro-optical module EOM, and the first region NSA may be a region disposed surrounding at least a portion of the second region SA. The second region SA may correspond to the sensing region SA-ED of the electronic device ED. The first region NSA may be a portion corresponding to the remaining region except for the second region SA of the display panel DP.

The second regions SA may include a first signal transmission region CSA corresponding to a camera sensing region CSA-ED of the electronic device ED and a second signal transmission region SSA corresponding to a sensor sensing region SSA-ED of the electronic device ED. In an embodiment, a camera module CAM may be disposed below the display panel DP to overlap the first signal transmission region CSA, and a sensor module SM may be disposed below the display panel DP to overlap the second signal transmission region SSA. Although not illustrated, a predetermined opening may be defined in one region of the second regions SA of the display panel DP if desired. That is, a portion of the display panel DP corresponding to the one region of the second regions SA may be removed or opened.

Although FIG. 2 illustrates an embodiment where the second regions SA includes the first signal transmission region CSA and the second signal transmission region SSA, that is, two transmission regions, the number of second regions SA is not limited thereto, and alternatively, the number of second regions SA in the display panel DP may be defined one, or three or more. Although FIG. 2 illustrates an embodiment where the shape of the second region SA is a circle or a square, the shape of the second region SA is not limited thereto, and may be defined in various ways as desired.

On a plane or when viewed in the third direction DR3, the area of the second region SA may be smaller than the area of the first region NSA. The transmittance of the first region NSA and the transmittance of second region SA may be different from each other. The transmittance of the second region SA may be higher than the first region NSA.

In the display panel DP according to an embodiment, a portion of the driving circuit or the driving wire for driving pixels PX (see FIG. 7) disposed in the second regions SA may be disposed in the non-display region NAA or on a portion of the first region NSA adjacent to the second region SA. Accordingly, wiring density in the second region SA may be lower than wiring density in the first region NSA. However, an embodiment of the invention is not limited thereto, and alternatively, the wiring density in the second region SA and the wiring density in the first region NSA may be substantially the same as each other.

The display panel DP may include a light emitting element layer DP-ED (see FIG. 4) including an organic light emitting element, a quantum dot light emitting element, a micro light emitting diode (LED) light emitting element, or nano LED light emitting element and the like. The light emitting element layer DP-ED (see FIG. 4) may be a component which substantially generates an image.

The lower member SP may be disposed below the display panel DP. The lower member SP may be a member that supports the display panel DP, absorbs shocks applied to the display panel DP, and performs heat dissipation function of dissipating heat generated from components disposed below the display panel DP, for example, from an electronic module EM and a power module PSM.

In the electronic device ED according to an embodiment, the electro-optical module EOM may be an electronic component that outputs or receives an optical signal. In an embodiment, for example, the electro-optical module EOM may include the camera module CAM and the sensor module SM. The camera module CAM may capture an external image by receiving external light through the camera sensing region CSA-ED. Also, the sensor module SM may be a sensor such as a proximity sensor or an infrared light emitting sensor that outputs or receives external light through the sensor sensing region SSA-ED.

The electronic module EM may further include a control module, a wireless communication module, an image input module, a sound input module, a sound output module, a memory, or an external interface module. The electronic module EM may include a main circuit board, and the modules may be mounted on the main circuit board, or electrically connected to the main circuit board through a flexible circuit board. The electronic module EM may be electrically connected with the power module PSM.

The power module PSM may supply power used for overall operation of the electronic device ED. In an embodiment, for example, the power module PSM may include a typical or conventional battery device.

Although not illustrated, the electronic device ED may further include a flexible circuit board electrically connected with the display panel DP and a main circuit board connected thereto. The flexible circuit board may be disposed on the peripheral region NDA of the display panel DP and be coupled with the display panel DP. The flexible circuit board may be connected to the main circuit board. The main circuit board may be one electronic component constituting the electronic module EM. A portion of the peripheral region NDA of the display panel DP adjacent to the flexible circuit board may be provided as a bending region. The bending region may be bent with respect to a bending axis parallel to the first direction DR1. Since the bending region is bent, the flexible circuit board may overlap a portion of the display panel DP on a plane.

The electronic device ED according to an embodiment may include the display device DD, the electro-optical module EOM, the electronic module EM and the housing HU disposed below the power module PSM. The electro-optical module EOM, the power module PSM, the electronic module EM, the display panel DP and the like may be accommodated in the housing HU. In the electronic device ED according to an embodiment, the window WM and the housing HU may be coupled to form the exterior of the electronic device ED.

Figure 3:
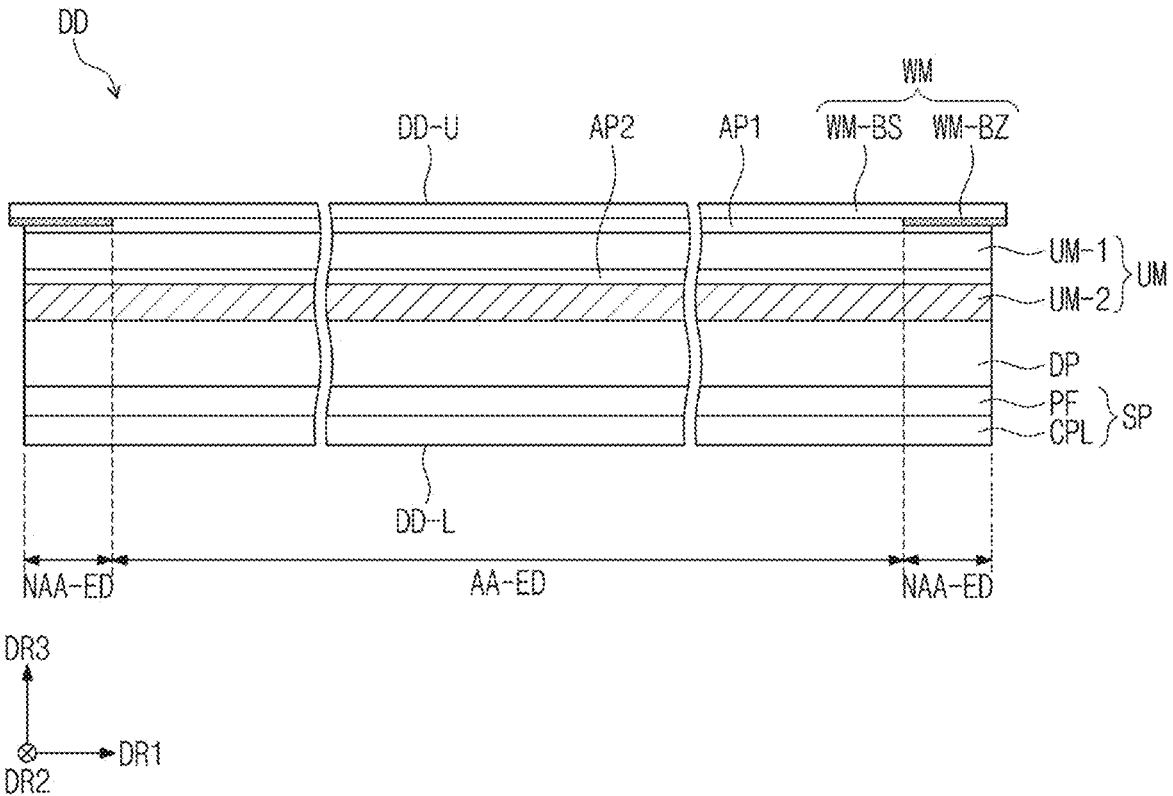
FIG. 3 is a cross-sectional view illustrating a partial configuration of a display device according to an embodiment of the invention.

FIG. 3 is a cross-sectional view illustrating a partial configuration of the display device DD according to an embodiment of the invention.

Referring to FIG. 3, the display device DD according to an embodiment of the invention may include the window WM, the upper member UM, the display panel DP and the lower member SP. The display device DD include a front surface DD-U and a rear surface DD-L, the front surface DD-U of the display device DD may be defined in (or by an upper surface of) the window WM, and the rear surface DD-L of the display device DD may be defined in (or by a lower surface of) the lower member SP.

In an embodiment, the window WM may cover the front surface of the display panel DP. The window WM may include a base substrate WM-BS and a bezel pattern WM-BZ. The base substrate WM-BS include a transparent base layer such as a glass substrate or a transparent film. The bezel pattern WM-BZ may have a multi-layer structure. The multi-layer structure may include a colored color layer and a black light-blocking layer. The colored color layer and the black light-blocking layer may be formed through deposition, printing or coating. Alternatively, the bezel pattern WM-BZ may be omitted from the window WM, and may be formed on the upper member UM instead of the base substrate WM-BS.

In an embodiment, the upper member UM include an anti-reflection layer UM-1 and an input sensor UM-2. In an embodiment, as illustrated in FIG. 3, the window WM and the anti-reflection layer UM-1 may be coupled through a first adhesive layer AP1, and the input sensor UM-2 may be combined through a second adhesive layer AP2. Alternatively, at least one selected from the first adhesive layer AP1 and the second adhesive layer AP2 may be omitted. In an embodiment, for example, the second adhesive layer AP2 may be omitted, and the anti-reflection layer UM-1 may be directly disposed on the input sensor UM-2.

The anti-reflection layer UM-1 may lower external light reflectance. The anti-reflection layer UM-1 may include a phase retarder and/or a polarizer. The anti-reflection layer UM-1 may include a polarizing film or color filters. The color filters may have a predetermined arrangement. The arrangement of the color filters may be determined considering the colors of light emitted by pixels included in the display panel DP. The anti-reflection layer UM-1 may further include a division layer adjacent to the color filters.

The input sensor UM-2 may include a plurality of sensing electrodes (not shown) for sensing external input, trace lines (not shown) connected to the plurality of sensing electrodes, and an inorganic layer and/or an organic layer for insulating/protecting the plurality of sensing electrodes or the trace lines. The input sensor UM-2 may be a capacitive sensor, but is not particularly limited thereto.

The input sensor UM-2 may be directly formed on a thin-film encapsulation layer through a continuous process when manufacturing the display panel DP. However, an embodiment of the invention is not limited thereto, and alternatively, the input sensor UM-2 may be manufactured as a separate panel from the display panel DP and attached to the display panel DP by an adhesive layer.

The lower member SP may include a protection film PF and a functional layer CPL. The protection film PF may be disposed below the display panel DP, and the functional layer CPL may be disposed below the protection film PF.

The protection film PF may be a component which is disposed below the display panel DP to support the display panel DP, while increasing resistance against a compressive force caused by to external pressure, thereby increasing the resistance of the display panel DP. The protection film PF may include a flexible plastic material such as polyimide or polyethylene terephthalate. The protection film PF may be a colored film having low light transmittance. Alternatively, the protection film PF may be omitted from the lower member SP. In an embodiment where the protection film PF is omitted, the functional layer CPL may be directly disposed below (or disposed directly on a lower surface of) the display panel DP.

The functional layer CPL may be a component which is disposed below the protection film PF, absorbs shocks applied on the display panel DP, and dissipates heat generated from components disposed below the display panel DP. In an embodiment, for example, the heat generated from the electronic module EM (see FIG. 2) and the power module PSM (see FIG. 2) of the aforementioned electronic device ED (see FIG. 2) may be dissipated by the functional layer CPL. The configuration of the functional layer CPL will be described in greater detail with reference to FIG. 5 and etc.

Figure 4:
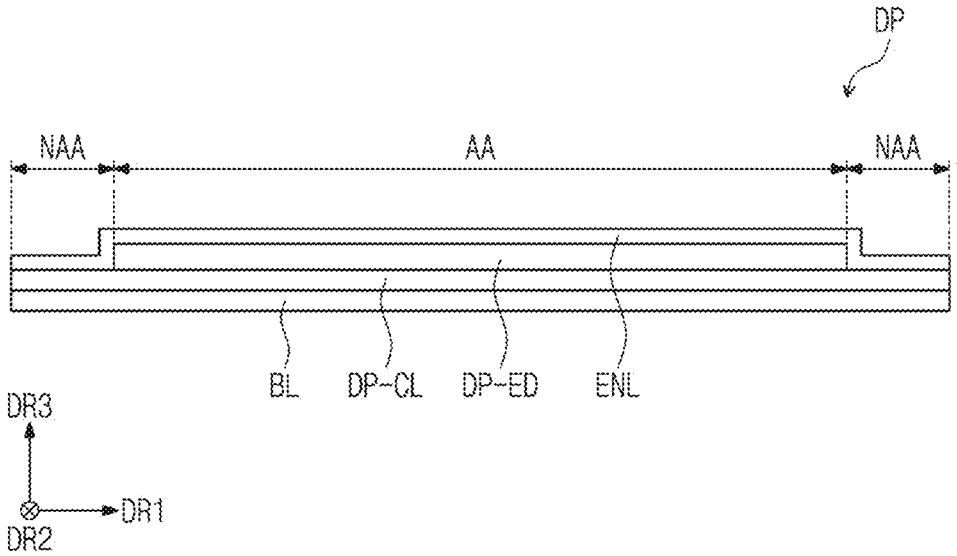
FIG. 4 is a cross-sectional view illustrating a display panel according to an embodiment.

FIG. 4 is a cross-sectional view illustrating the display panel DP according to an embodiment.

In an embodiment, the display panel DP includes a base layer BL, a circuit layer DP-CL disposed on the base layer BL, and a light-emitting element layer DP-ED and an encapsulation layer ENL.

The base layer BL may include a plastic substrate, a glass substrate, a metal substrate, organic/inorganic composite material substrate, or the like. In an embodiment, for example, the base layer BL may include at least one polyimide layer. The aforementioned lower member SP may be disposed under the base layer BL.

The circuit layer DP-CL include at least one insulation layer, semiconductor patterns, and conductive patterns. The insulation layer includes at least one inorganic layer and at least one organic layer. The semiconductor patterns and the conductive patterns may constitute or define signal lines, a pixel-driving circuit, and a scan-driving circuit. Also, the circuit layer DP-CL may include a back metal layer.

The light emitting element layer DP-ED include a display element, such as a light emitting element. In an embodiment, for example, the light emitting element may be an organic light emitting element, a quantum dot light emitting element, a micro LED light emitting element or a nano LED light emitting element. The light emitting element layer DP-ED may further include an organic layer such as a pixel-defining film.

The light emitting element layer DP-ED may be disposed in the display region AA. The non-display region NAA is disposed on the periphery of the display region AA to surround the display region AA, and thus no light emitting element may be disposed in the non-display region NAA.

The encapsulation layer ENL is disposed in the light emitting element layer DP-ED and may cover the light emitting element layer DP-ED. The encapsulation layer ENL may be disposed on the circuit layer DP-CL to encapsulate the light emitting element layer DP-ED. The encapsulation layer ENL may be a thin-film encapsulation layer including a plurality of organic thin-film and inorganic thin-films. The encapsulation layer ENL may include a thin-film encapsulation layer including a stack structure of an inorganic layer/organic layer/inorganic layer. The stack structure of the encapsulation layer ENL is not particularly limited.

FIG. 5 is a cross-sectional view of the functional layer CPL according to an embodiment of the invention.

Referring to FIG. 5, in an embodiment, the functional layer CPL includes an adhesive layer EL, a first heat dissipation layer HDL1 disposed below the adhesive layer EL, a cushion layer HDF disposed below the first heat dissipation layer HDL1, and a second heat dissipation layer HDL2 disposed below the cushion layer HDF.

The adhesive layer EL may be a component which is disposed in the upper portion of the functional layer CPL, and attaches the functional layer CPL to component disposed on top of the functional layer CPL. The material of the adhesive layer EL is not particularly limited, and any adhesive material that is widely known to those skilled in the art may be used. In an embodiment, for example, various polymer resins may be used as a material for the adhesive layer EL. In an embodiment, for example, the adhesive layer EL may include a pressure sensitive adhesive (PSA).

The adhesive layer EL may include an adhesive base ADB and a protruding pattern PP. The protruding pattern PP may be defined on the upper portion of the adhesive layer EL.

The adhesive base ADB includes an upper surface and a lower surface opposite to the upper surface, and the protruding pattern PP may be disposed on the upper surface. The upper surface of the adhesive base ADB is the surface adjacent to the display panel DP (see FIG. 3) disposed on the upper portion of the functional layer CPL, and the lower surface may be the surface adjacent to the first heat dissipation layer HDL1. The protruding pattern PP is disposed on the upper surface of the adhesive base ADB, and may be defined as an embossing-pattern protruding upwards from the adhesive base ADB. The protruding pattern PP is disposed on top of the adhesive base ADB, and may have a shape protruding in a direction away from the first heat dissipation layer HDL 1. The protruding pattern PP may be integrally formed with the adhesive base ADB as a single unitary and indivisible part. The protruding pattern PP may have an integral shape with the adhesive base ADB. Although FIG. 5 illustrates an embodiment where the protruding pattern PP has a semicircular shape in cross section, the shape of the protruding pattern PP is not limited thereto, and may have a quadrangular, semielliptical, or polygonal shape.

The adhesive layer EL included in the functional layer CPL according to an embodiment includes the adhesive base ADB and the protruding pattern PP disposed thereon, and may thus improve the adhesion between the functional layer CPL and a component disposed thereon in the adhesion process. The adhesive layer EL includes the protruding pattern PP to increase the adhesive area between the functional layer CPL and the protection film PF disposed thereon, thereby improving the adhesion between the functional layer CPL and the protection film PF. in an embodiment, as illustrated in FIG. 3, in a state in which the functional layer CPL is laminated under the display panel DP, the protruding pattern PP may be removed, and the upper surface of the adhesive layer EL may be provided as a flat surface.

The adhesive layer EL may have a thickness in a range of about 10 micrometers ($\mu$m) to about 50 $\mu$m. In an embodiment, for example, the adhesive layer EL may have a thickness in a range of about 15 $\mu$m to about 30 $\mu$m. The adhesive layer EL may have a thickness of about 25 $\mu$m. If the adhesive layer EL has a thickness of less than about 10 $\mu$m, the adhesive function of the adhesive layer EL may deteriorate. If the adhesive layer EL has a thickness of greater than about 50 $\mu$m, the thickness of the functional layer CPL may increase, so that the overall thickness of the display device DD (see FIG. 3) may increase.

The adhesive layer EL may have a predetermined adhesion. The adhesive layer EL may have adhesion of about 100 gram-force per inch (g·f/inch) or greater. In an embodiment, for example, the adhesive layer EL may have high surface adhesion of about 1000 g. f/inch or greater.

The first heat dissipation layer HDL1 is disposed below the adhesive layer EL. The first heat dissipation layer HDL1 may be directly disposed below the adhesive layer EL, that is, disposed directly on a lower surface of the adhesive layer EL. The first heat dissipation layer HDL1 may contact the lower surface of the aforementioned adhesive base ADB.

The cushion layer HDF may be disposed below the first heat dissipation layer HDL1. The cushion layer HDF may be directly disposed below the first heat dissipation layer HDL1. The cushion layer HDF may contact the lower surface of the first heat dissipation layer HDL1. The cushion layer HDF may include a first surface HDF-U and a second surface HDF-L, and the first heat dissipation layer HDL1 may contact the first surface HDF-U of the cushion layer HDF.

The second heat dissipation layer HDL2 is disposed below the cushion layer HDF. The second heat dissipation layer HDL2 may contact the second surface HDF-L of the aforementioned cushion layer HDF. The second heat dissipation layer HDL2 may be a component disposed on the lowermost portion of the functional layer CPL.

The first heat dissipation layer HDL1 and the second heat dissipation layer HDL2 may be components that are disposed on the upper portion and on the lower portion of the cushion layer HDF, respectively, and substantially perform the heat dissipation function. In such an embodiment where the functional layer CPL includes the first heat dissipation layer HDL1 and the second heat dissipation layer HDL2, the heat generated from components disposed below the display panel DP (see FIG. 3) may be dissipated by each of the first heat dissipation layer HDL1 and the second heat dissipation layer HDL2, thereby effectively preventing the heat from being transferred to the display panel DP (see FIG. 3).

The first heat dissipation layer HDL1 and the second heat dissipation layer HDL2 may each include a heat-dissipating material. The first heat dissipation layer HDL1 and the second heat dissipation layer HDL2 may each include at least one selected from a heat-conducting metal, a carbon-based heat-dissipating material, and a heat-conducting polymer. The first heat dissipation layer HDL1 and the second heat dissipation layer HDL2 may each include, as a heat-dissipating material, a heat-conducting metal such as aluminum, copper, silver, or magnesium. Alternatively, the first heat dissipation layer HDL1 and the second heat dissipation layer HDL2 may each include, as a heat-dissipating material, a carbon-based heat-dissipating material such as graphene, graphite, or carbon nanotube. Alternatively, the first heat dissipation layer HDL1 and the second heat dissipation layer HDL2 may each include, as a heat-dissipating material, a heat-conducting polymer such as ultra-high molecular polyethylene. In an embodiment, where the first heat dissipation layer HDL1 and the second heat dissipation layer HDL2 each include a carbon-based heat-dissipating material or a heat-conducting polymer, high-polymer coatings may be respectively provided to the upper portion and the lower portion of each of the first heat dissipation layer HDL1 and the second heat dissipation layer HDL2 to prevent generation of dust or the like from the first heat dissipation layer HDL1 and the second heat dissipation layer HDL2 in the middle of the process.

In an embodiment, at least one selected from the first heat dissipation layer HDL1 and the second heat dissipation layer HDL2 may include a material having a shielding function. In an embodiment, at least one selected from the first heat dissipation layer HDL1 and the second heat dissipation layer HDL2 may include an electromagnetic shield material. In such an embodiment where at least one selected from the first heat dissipation layer HDL1 and the second heat dissipation layer HDL2 includes the electromagnetic shield material, an electric field and a magnetic field generated from electronic components disposed therebelow may be effectively prevented from being transferred to the display panel DP (see FIG. 3) thereabove.

The first heat dissipation layer HDL1 and the second heat dissipation layer HDL2 each may have a high heat conductivity. Each of the first heat dissipation layer HDL1 and the second heat dissipation layer HDL2 may have a heat conductivity of about 10 W/(m·K) or greater. In an embodiment, for example, each of the first heat dissipation layer HDL1 and the second heat dissipation layer HDL2 may have a high heat conductivity of about 100 W/(m·K) or greater. In such an embodiment where the first heat dissipation layer HDL1 and the second heat dissipation layer HDL2 each have a high heat conductivity, the heat generated from the components disposed below the display panel DP (see FIG. 3) may be effectively dissipated. In such an embodiment, the first heat dissipation layer HDL1 and the second heat dissipation layer HDL2 may allow the heat to be transferred therethrough in a direction parallel to a plane parallel to each of the first direction DR1 and the second direction DR2.

The first heat dissipation layer HDL1 and the second heat dissipation layer HDL2 may each have a thickness in a range of about 10 μm to about 100 μm. In an embodiment, for example, the first heat dissipation layer HDL1 and the second heat dissipation layer HDL2 may each have a thickness in a range of about 30 μm to about 50 μm. The first heat dissipation layer HDL1 and the second heat dissipation layer HDL2 may each have a thickness of about 35 μm. If the first heat dissipation layer HDL1 and the second heat dissipation layer HDL2 each have a thickness of less than about 10 μm, the heat dissipation function of the functional layer CPL may deteriorate. If the first heat dissipation layer HDL1 and the second heat dissipation layer HDL2 each have a thickness of more than about 100 μm, the process-ability in the process for forming the cushion layer HDF which will be described later deteriorates, so that the process for forming the cushion layer HDF may not be effectively performed.

The cushion layer HDF is disposed between the first heat dissipation layer HDL1 and the second heat dissipation layer HDL2, has a low modulus to absorb shocks applied from the outside, and thus may protect the display panel DP (see FIG. 3), etc., from the external shocks.

The cushion layer HDF may include a shock-absorbing material such as a foam or a sponge. The cushion layer HDF may include acryl-based polymer resin or urethane-based polymer resin. A plurality of pores PR are defined inside the cushion layer HDF, and may absorb external shocks effectively.

In an embodiment, the cushion layer HDF may include a shock absorbing material as a base material, and also include heat-conducting particles HCP dispersed in the base material. In such an embodiment where the cushion layer HDF includes the heat conducting particles HCP, the cushion layer HDF may have predetermined heat conductivity. The cushion layer HDF may have a heat conductivity in a range of about 0.1 watt per meter-Kelvin (W/(m·K)) to about 100 W/(m·K). The cushion layer HDF may have a heat conductivity, for example, in a range of about 10 W/(m·K) to about 20 W/(m·K).

The heat conducting particles HCP included in the cushion layer HDF, may include, for example, at least one selected from a heat-conducting metal, a carbon-based heat-dissipating material, a ceramic heat-dissipating material, and a combination thereof. The heat conducting particles HCP included in the cushion layer HDF, may include, for example, a heat-conducting metal such as aluminum, copper, silver, or magnesium. Alternatively, the heat-conducting particles HCP included in the cushion layer HDF may include a carbon-based heat-dissipating material such as graphene, graphite, or carbon nanotube. Alternatively, the heat conducting particles HCP included in the cushion layer HDF may include a ceramic heat-dissipating material such as boron nitride, aluminum nitride, aluminum oxide, or silicon carbide.

The content of the heat conducting particles HCP included in the cushion layer HDF may be about 75 volume percent (vol %) or less with respect to the total volume of the cushion layer HDF. In an embodiment, the total volume of the cushion layer HDF is the sum of the volume of the base material and the volume of the heat conducting particles HCP included in the cushion layer HDF, and the volume of the pores PR may be excluded. If the content of the heat-conducting particles is greater than about 75 vol %, the adhesion of the cushion layer HDF and a shock absorbing characteristic may significantly deteriorate to cause detachment between the cushion layer HDF and adjacent components, and the shock absorbing characteristic of the entire functional layer CPL deteriorates to cause a defect that the display panel DP (see FIG. 3) is damaged due to the external shock.

The cushion layer HDF may have a thickness in a range of about 50 μm to about 200 μm. In an embodiment, for example, the cushion layer HDF may have a thickness in a range of about 100 μm to about 150 μm. The cushion layer HDF may have a thickness of about 130 μm. If the cushion layer has a thickness of less than about 50 μm, the shock absorbing characteristic of the functional layer CPL may deteriorate. If the cushion layer HDF has a thickness of greater than about 200 μm, the cushion layer may not be effectively formed by a process of forming the cushion layer HDF which will be described later.

The cushion layer HDF are directly bonded to an upper component thereabove and a lower component thereunder without an additional adhesive layer. The upper component above the cushion layer HDF is directly disposed on top of the cushion layer HDF, and the lower component under the cushion layer HDF is directly disposed under the cushion layer HDF. In an embodiment, for example, referring to FIG. 5, the first heat dissipation layer HDL1 is disposed directly on the first surface HDF-U of the cushion layer HDF, and the second heat dissipation layer HDL2 is disposed directly on the second surface HDF-L of the cushion layer HDF.

The functional layer included in the display panel according to an embodiment includes the cushion layer having a structure in which the cushion layer are directly bonded to the upper component and the lower component without an adhesive layer. Additionally, the cushion layer includes heat conducting particles and thus have predetermined heat conductivity. Accordingly, the functional layer disposed on the lower portion of the display device has a simplified structure, and also has high heat conductivity, thereby effectively dissipating the heat generated by the lower components of the display panel. Accordingly, the heat generated by the power module and the electronic module, etc., included in the electronic device is effectively prevented from being transferred to the display panel, and the durability and reliability of the display device may be improved.

Specifically, the display device according to an embodiment has a structure in which the adhesive layer, the first heat dissipation layer, the cushion layer, and the second heat dissipation layer are sequentially stacked from the top, and the cushion layer including the heat conducting particles has a predetermined adhesion, and may have a structure in which the cushion layer is directly bonded to the upper component and the lower component without an additional adhesive layer. Accordingly, the functional layer disposed on the lower portion of the display device may have a simplified structure, thereby reducing the unit cost, the weight, and the thickness of the display device. In addition, the functional layer having the simplified structure has high heat dissipation characteristic, so that heat generated by the power module and electronic module included in the electronic device may be effectively blocked, thereby preventing a defect such as deterioration of the display panel, and improving the durability and reliability of the display device.

In an embodiment, at least a portion of the adhesive layer EL, the first heat dissipation layer HDL1, the cushion layer HDF, and the second heat dissipation layer HDL2 included in the functional layer CPL may further include an additional additive such as a light blocking material, a foaming agent, and elastic hollow particles.

At least one selected from the adhesive layer EL, the first heat dissipation layer HDL1, the cushion layer HDF, and the second heat dissipation layer HDL2 may include a light blocking material. In an embodiment, for example, the cushion layer HDF or the adhesive layer EL may have a black color by including a light-blocking additive such as light blocking particles. The cushion layer HDF or the adhesive layer EL may include, for example, a black pigment or black dye. The adhesive layer EL may include, for example, a carbon-based material such as graphene or graphite as an additive. However, an embodiment of the invention is not limited thereto, and alternatively, the adhesive layer EL, the first heat dissipation layer HDL1, the cushion layer HDF, and the second heat dissipation layer HDL2 may each include no additional light blocking particles, and include a black-series material or a adopt a black coating to have a light-blocking function. In an embodiment, for example, at least one of the first heat dissipation layer HDL1 or the second heat dissipation layer HDL2 includes a carbon-based heat dissipating material such as graphite and graphene, and may have a light blocking characteristic.

At least one selected from the adhesive layer EL, the first heat dissipation layer HDL1, the cushion layer HDF, and the second heat dissipation layer HDL2 may include an additional additive for shock absorption, such as a foaming agent and elastic hollow particles. In an embodiment, for example, the adhesive layer EL may include at least one selected from the foaming agent and the elastic hollow particles. As the adhesive layer EL includes the foaming agent or the elastic hollow particles, pores are additionally defined in the adhesive layer EL and may improve the shock absorbing characteristic of the adhesive layer EL. In an embodiment where the cushion layer HDF includes a particulate additive such as the heat-conducting particles HCP, the shock absorbing characteristic of the cushion layer HDF may be deteriorate. However, the functional layer CPL according to an embodiment includes the additional shock-absorbing additive to the adhesive layer EL, and thus compensate deterioration of the shock absorbing characteristic of the cushion layer HDF, thereby effectively preventing deterioration of the shock absorbing characteristic of the functional layer CPL.

Each of FIG. 6A to FIG. 6C is a cross-sectional view of a functional layer according to an embodiment of the invention. FIG. 6A to FIG. 6C illustrate functional layers CPL-1, CPL-2, CPL-3 according to alternative embodiments which differ from the functional layer CPL according to the embodiment illustrated in FIG. 5. Hereinafter, while the functional layers CPL-1, CPL-2, CPL-3 according to alternative embodiments will be described with reference to FIG. 6A to FIG. 6C, the same reference numerals or symbols are given to the same components as those described above with reference to FIG. 5, and any repetitive detailed description thereof will be omitted.

Referring to FIG. 6A, a functional layer CPL-1 according to an embodiment may further include an additional heat dissipation layer AFL. The additional heat dissipation layer AFL may be disposed adjacent to at least one selected from a first heat dissipation layer HDL1 and a second heat dissipation layer HDL2. In an embodiment, as illustrated in FIG. 6A, the additional heat dissipation layer AFL may be disposed adjacent to the first heat dissipation layer HDL1. In an embodiment, the additional heat dissipation layer AFL may be disposed between the first heat dissipation layer HDL1 and the cushion layer HDF. However, an embodiment of the invention is not limited thereto, and alternatively, the additional heat dissipation layer AFL may be disposed on top of the first heat dissipation layer HDL1, or the additional heat dissipation layer AFL may be disposed on top of or under the second heat dissipation layer HDL2.

The additional heat dissipation layer AFL may include a heat-dissipating material. In an embodiment, the additional heat dissipation layer AFL may include a heat-dissipating material different from those of the first heat dissipation layer HDL1 and the second heat dissipation layer HDL2. The additional heat dissipation layer AFL may include at least one selected from a heat-conducting metal, a carbon-based heat-dissipating material, and a heat-conducting polymer. In an embodiment, for example, the first heat dissipation layer HDL1 and the second heat dissipation layer HDL2 may each include a heat-conducting metal such as aluminum, copper, silver or magnesium, as a heat-dissipating material, and the additional heat dissipation layer AFL may include, as the heat-dissipating material, a carbon-based heat-dissipating material such as graphene, graphite or carbon nanotube.

The additional heat dissipation layer AFL may be thinner than each of the first heat dissipation layer HDL1 and the second heat dissipation layer HDL2. In an embodiment, the additional heat dissipation layer AFL may have a thickness in a range of about 0.01 μm to about 1 μm. In an embodiment, for example, the additional heat dissipation layer AFL may have a thickness of about 0.2 μm.

Referring to FIG. 6B, a functional layer CPL-2 according to an alternative embodiment may further include a primer layer PL. The primer layer PL may be applied on at least one surface of the cushion layer HDF. In an embodiment, for example, as illustrated in FIG. 6B, the primer layer PL may be applied or defined on a first surface HDF-U of the cushion layer HDF. The primer layer PL may be directly disposed on the first surface HDF-U of the cushion layer HDF. However, an embodiment of the invention is not limited thereto, and alternatively, the primer layer PL may be applied on the second surface HDF-L of the cushion layer HDF.

The primer layer PL may include an adhesion improving material to improve adhesion between the cushion layer HDF and adjacent components. The primer layer PL may be disposed between the cushion layer HDF and the first heat dissipation layer HDL1, and may improve the adhesion between the cushion layer HDF and the first heat dissipation layer HDL1. In an embodiment where the cushion layer HDF included in the functional layer CPL-2 includes a particulate additive such as heat-conducting particles HCP, the adhesion of the of the cushion layer HDF may be reduced. In such an embodiment, the functional layer CPL-2 includes a primer layer PL applied on at least one surface of the cushion layer HDF, such that sufficient adhesion may be secured among adjacent components, thereby effectively preventing a defect in which each component included in the functional layer CPL-2 is detached.

Referring to FIG. 6C, the functional layer CPL-3 according to another alternative embodiment may further include a shock absorbing layer SAL. The shock absorbing layer SAL may be disposed below the second heat dissipation layer HDL2. The shock absorbing layer SAL is disposed below the second heat dissipation layer HDL2, and may be defined as a lowermost component of the functional layer CPL-3.

The shock absorbing layer SAL may include a shock absorbing material. The shock absorbing layer SAL may include, for example, a urethane-based material or a silicon-based material. The shock absorbing layer SAL may include a material having a large loss factor (tan 6) value, and may have a high shock absorbing characteristic. In an embodiment, the shock absorbing layer SAL may have a thickness in a range of about 1 μm to about 20 μm. In an embodiment, for example, the shock absorbing layer SAL may have a thickness of about 10 μm.

FIG. 7 is a cross-sectional view of a cushion layer according to an embodiment of the invention. FIG. 7 illustrates a cross section of the cushion layer HDF included in each of the functional layers of FIG. 5 and FIG. 6A to FIG. 6C.

Referring to FIG. 5 and FIG. 7, in an embodiment, the cushion layer HDF may include a center layer CL and skin layers SL1 and SL2 disposed on top of and under the center layer CL. The skin layers SL1 and SL2 may include a first skin layer SL1 disposed on top (or an upper surface) of the center layer CL, and a second skin layer SL2 disposed under (or on a lower surface of) the center layer CL. The first skin layer SL1 may define the first surface HDF-U of the cushion layer HDF described above, and the second skin layer SL2 may define the second surface HDF-L of the cushion layer HDF described above. The skin layers SL1, SL2 may be integrally formed with the center layer CL as a single unitary and indivisible part. The skin layers SL1 and SL2 may have an integral shape with the center layer CL.

The center layer CL is a component that occupies most of the cushion layer HDF, and may be a portion in which the pores PR described above are defined in the cushion layer HDF. The size of each of the pores PR defined in the center layer CL may be smaller or less than the thickness of the center layer CL. The center layer CL may have a thickness in a range of about 90% to about 96% of the total thickness of the cushion layer HDF. The center layer CL may include the heat conducting particles HCP described above.

The skin layers SL1 and SL2 have a relatively small (or thin) thickness and have a predetermined adhesion so that the cushion layer HDF may be directly bonded to an upper component disposed thereabove and a lower component disposed thereunder without an additional adhesive layer. As the cushion layer HDF includes the skin layers SL1 and SL2, the cushion layer HDF may have an adhesion of about 100 g·f/inch or greater. The cushion layer HDF may have a high surface adhesion of about 1000 g. f/inch or greater.

FIG. 8 is a plan view of partial configuration included in the functional layer according to an embodiment of the invention. FIG. 8 schematically illustrates a planar shape of the second heat dissipation layer HDL2 included in the functional layer.

Referring to FIG. 5 and FIG. 8 together, the second heat dissipation layer HDL2 included in the functional layer CPL according to an embodiment may include a first heat dissipation portion HDL2-1 and a second heat dissipation portion HDL2-2. The first heat dissipation portion HDL2-1 may include a first first heat dissipation portion HDL2-11 and a second first heat dissipation portion HDL2-12 which are spaced apart along a second direction DR2 with the second heat dissipation portion HDL2-2 therebetween. The first heat dissipation portion HDL2-1 may overlap a portion of the cushion layer HDF on a plane, and the second heat dissipation portion HDL2-2 may overlap the remaining portion of the cushion layer HDF on a plane.

The first heat dissipation portion HDL2-1 and the second heat dissipation portion HDL2-2 may include different materials from each other. In an embodiment, the first heat dissipation portion HDL2-1 may include a material having higher heat conductivity than a material included in the second heat dissipation portion HDL2-2. The first heat dissipation portion HDL2-1 may have a high heat conductivity, and thus may effectively dissipate heat generated from an electronic component disposed therebelow. However, an embodiment of the invention is not limited thereto, and material included in the second heat dissipation portion HDL2-2 may include material having higher heat conductivity than the material included in the first heat dissipation portion HDL2-1.

Although, FIG. 8 illustrates an embodiment of the second heat dissipation layer HDL2, where the first heat dissipation portion HDL2-1 is defined on opposing end portions thereof, which are spaced apart in the second direction DR2, and the second heat dissipation portion HDL2-2 is defined at the center, the planar shape of the first heat dissipation portion HDL2-1 and the second heat dissipation portion HDL2-2 are not limited thereto. The planar shapes of the first heat dissipation portion HDL2-1 and the second heat dissipation portion HDL2-2 may be appropriately or variously modified to secure the heat dissipation characteristic according to the external shape of the display device and the arrangement position of electronic components.

FIG. 9A and FIG. 9B are captured images showing temperature gradients of the front surface and the rear surface of the display device according to Comparative Example. FIG. 10A and FIG. 10B are captured images showing temperature gradients of the front surface and the rear surface of the display device according to Example. Here, the display device according to Example is a display device including, in a lower member, the functional layer structure according to an embodiment described above with reference to FIG. 5. The display device according to Comparative Example is a display device including, in a lower member, a functional layer structure in which the first heat dissipation layer disposed on the cushion layer is omitted, and a black polyethylene terephthalate (PET) film is disposed between the cushion layer and the adhesive layer. Additionally, the functional layer included in the display device according to Comparative Example does not include heat conducting particles in the cushion layer, and has a structure in which an additional adhesive layer is disposed between the cushion layer and the PET film, and between the cushion layer and the second heat dissipation layer.

Referring to FIG. 9A and FIG. 10A together, it is confirmed that the surface temperature of the front surface DD-U of the display device according to Example is lower than that of the front surface DD-Uc of the display device according to Comparative Example, and in particular, the surface temperature in the heating portion HP defined in the lower portion is lowered. In addition, referring to FIG. 9B and FIG. 10B together, it is confirmed that a rear surface DD-L of the display device according to Example also has a lower surface temperature than a rear surface DD-Lc of the display device according to Comparative Example, and in particular, the surface temperature in the heating portion HP defined in the lower portion is lowered. Here, the heating portion HP may be a portion in which electronic components such as the power module and the electronic module described with reference to FIG. 2 are disposed. Referring to the images of FIG. 9A, FIG. 9B, FIG. 10A, and FIG. 10B, it is confirmed that the display device including the functional layer according to Example has an improved heat dissipation characteristic and effectively dissipates heat generated from electronic components, and thus that the temperatures measured at the front surface and the rear surface of the display device are lowered.

FIG. 11 is a flowchart of a method of manufacturing a display device according to an embodiment of the invention.

Referring to FIG. 11, the method of manufacturing a display device according to an embodiment includes an operation of providing a display panel (S100) and an operation of bonding a functional layer under the display panel (S200). The method of manufacturing a display device according to an embodiment includes forming the functional layer described above with reference to FIG. 5 and FIG. 6A to FIG. 6C, and bonding the functional layer under the display panel. The operation of forming the functional layer may include the operation of performing a coating on a cushion layer using at least one selected from the first heat dissipation layer and the second heat dissipation layer as a base layer.

FIG. 12A, FIG. 12B, FIG. 13A, FIG. 13B, FIG. 14A, and FIG. 14B each are cross-sectional views of some operations of the method of manufacturing a display device according to an embodiment of the invention. Each of FIG. 12A, FIG. 12B, FIG. 13A, FIG. 13B, FIG. 14A, and FIG. 14B schematically illustrates the operation of foaming the functional layer in an embodiment.

Figure 12A:
Figure 12A:
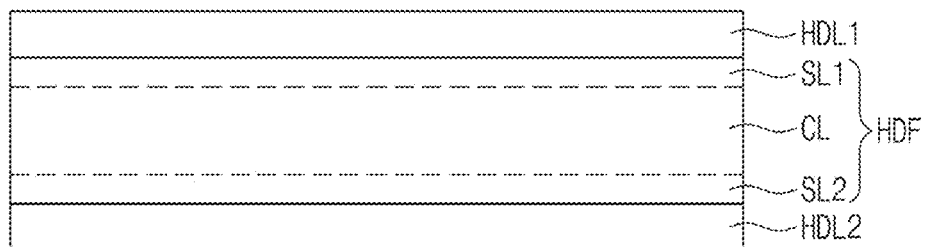
Figure 12B:
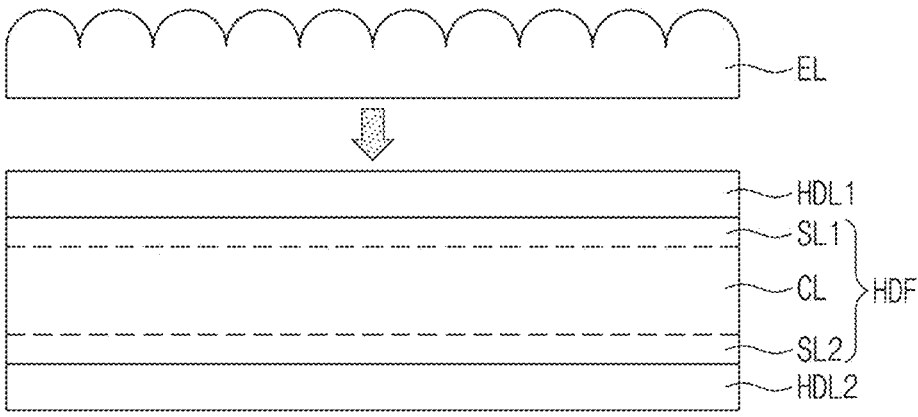

Referring to FIG. 12A and FIG. 12B, in the operation of forming the functional layer according to an embodiment, the cushion layer HDF may be formed using the first heat dissipation layer HDL1 and the second heat dissipation layer HDL2 each as a base layer. In an embodiment, the cushion layer HDF includes a foam, and the foam may be directly formed on the base material through the foaming process. As the cushion layer HDF is formed through the foaming process, the cushion layer HDF may be formed to contact the upper component and the lower component providing a base surface without an additional adhesive layer. As the cushion layer HDF is formed through the foaming process between the first heat dissipation layer HDL1 and the second heat dissipation layer HDL2, a preliminary functional layer CPL-C may be formed. Thereafter, the adhesive layer EL may be bonded to the upper portion of the preliminary functional layer CPL-C, and the functional layer may be formed. The adhesive layer EL has a predetermined adhesion and may be bonded to the first heat dissipation layer HDL1 without an additional component therebetween.

Figure 13A:
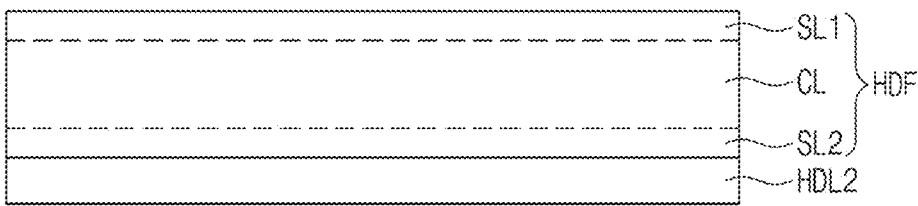
Figure 13B:
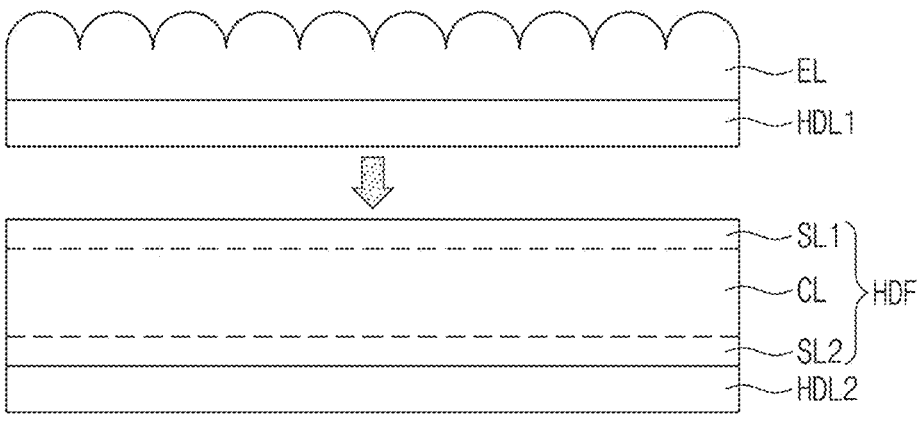

Referring to FIG. 13A and FIG. 13B, in the operation of forming the functional layer according to an alternative embodiment, the cushion layer HDF may be formed using only the second heat dissipation layer HDL2 as a base layer. As the cushion layer HDF is formed through the foaming process, the cushion layer HDF may be formed to contact the second heat dissipation layer HDL2 providing a base surface without an additional adhesive layer. As the cushion layer HDF is formed through the foaming process on top of the second heat dissipation layer HDL2 through a foaming process, a preliminary functional layer CPL-C1 may be formed. Thereafter, the first heat dissipation layer HDL1 is bonded to the upper portion of the preliminary functional layer CPL-C1, and the functional layer may be formed. Meanwhile, the adhesive layer EL may be bonded to the preliminary functional layer CPL-C1 while adhering to the upper portion of the first heat dissipation layer HDL1. Since the cushion layer HDF has a predetermined adhesion, the cushion layer HDF and the first heat dissipation layer HDL1 may be bonded without an additional adhesive layer therebetween.

Figure 14A:
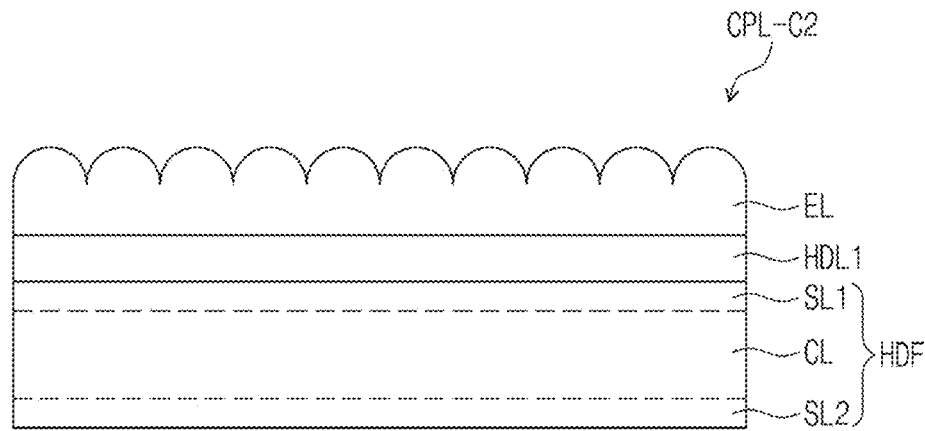
Figure 14B:
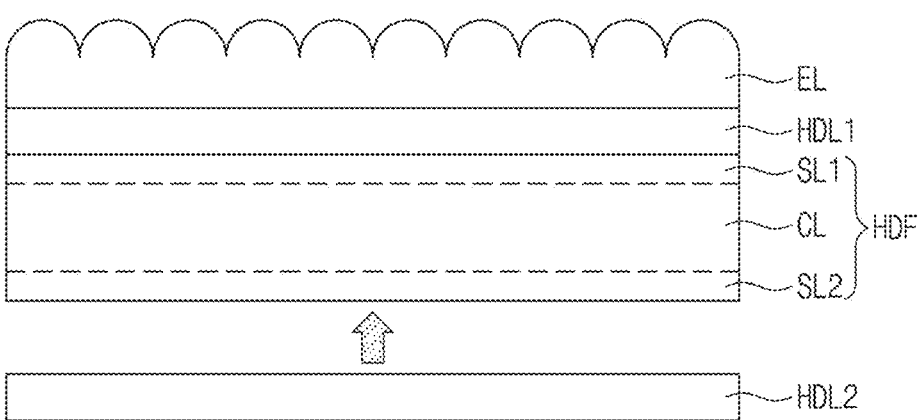

Referring to FIG. 14A and FIG. 14B, in the operation of forming the functional layer according to an embodiment, the cushion layer HDF may be formed using only the first heat dissipation layer HDL1 as a base layer. As the cushion layer HDF is formed through the foaming process, the cushion layer HDF may be formed to contact the first heat dissipation layer HDL1 providing the base surface without an additional adhesive layer. As the cushion layer HDF is formed through the foaming process under the first heat dissipation layer HDL1, the preliminary functional layer CPL-C2 may be formed. In such an embodiment, in the preliminary functional layer CPL-C2, the adhesive layer EL may be bonded to the first heat dissipation layer HDL 1. Thereafter, the second heat dissipation layer HDL2 is bonded to the lower portion of the preliminary functional layer CPL-C2, and the functional layer may be formed.

Since the cushion layer HDF has a predetermined adhesion, the cushion layer HDF and the second heat dissipation layer HDL2 may be bonded without an additional adhesive layer therebetween.

According to an embodiment of the invention, the functional layer having a structure in which a heat dissipation layer is disposed, without an additional layer, on opposing surfaces of the cushion layer formed through a foaming process is provided on the lower portion of the display panel, thereby reducing the unit cost, the weight, and the thickness of the display device. In such an embodiment, the functional layer, despite a simplified structure thereof, has a high heat dissipation characteristic, thereby effectively preventing a defect such as deterioration of the display panel, and improving the durability and reliability of the display device.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel which displays an image; and
a functional layer disposed below the display panel,
wherein the functional layer includes:
an adhesive layer disposed below the display panel;
a first heat dissipation layer disposed below the adhesive layer;
a cushion layer disposed below the first heat dissipation layer, and including heat-conducting particles; and
a second heat dissipation layer disposed below the cushion layer,
wherein the adhesive layer is an uppermost layer of the functional layer, and the first heat dissipation layer is disposed between the adhesive layer and the cushion layer, and
wherein the cushion layer comprises:
skin layers adjacent to the first heat dissipation layer and the second heat dissipation layer; and
a central layer disposed between the skin layers, wherein pores are defined in the central layer.

2. The display device of claim 1, wherein at least one selected from the first heat dissipation layer and the second heat dissipation layer comprises an electromagnetic shield material.

3. The display device of claim 1, wherein
the first heat dissipation layer and the second heat dissipation layer each comprise a heat-dissipating material,
the heat-dissipating material includes at least one selected from a heat-conducting metal, a carbon-based heat-dissipating material, and a heat-conducting polymer.

4. The display device of claim 1, wherein the heat-conducting particles each comprise at least one selected from a heat-conducting metal, a carbon-based heat-dissipating material, and a ceramic heat-dissipating material, and a combination thereof.

5. The display device of claim 1, wherein the cushion layer has a heat conductivity in a range of about 0.1 W/(m·K) to about 100 W/(m·K).

6. The display device of claim 1, wherein the adhesive layer has a thickness in a range of about 10 μm to about 50 μm.

7. The display device of claim 1, wherein the first heat dissipation layer and the second heat dissipation layer each have a thickness in a range of about 10 μm to about 100 μm.

8. The display device of claim 1, wherein the cushion layer has a thickness in a range of about 50 μm to about 200 μm.

9. The display device of claim 1, wherein
the first heat dissipation layer is directly disposed below the adhesive layer,
the cushion layer is directly disposed below the first heat dissipation layer, and
the second heat dissipation layer is directly disposed below the cushion layer.

10. The display device of claim 1, wherein
the cushion layer comprises a first surface adjacent to the first heat dissipation layer, and a second surface adjacent to the second heat dissipation layer, and
the functional layer further comprises a primer layer disposed on at least one selected from the first surface and the second surface.

11. The display device of claim 1, wherein
the functional layer further comprises an additional heat dissipation layer disposed adjacent to at least one selected from the first heat dissipation layer and the second heat dissipation layer,
wherein the additional heat dissipation layer includes a heat-dissipating material different from heat-dissipating materials of the first heat dissipation layer and the second heat dissipation layer.

12. The display device of claim 1, wherein
the functional layer further comprises a shock-absorbing layer disposed below the second heat dissipation layer,
wherein the shock-absorbing layer includes a shock-absorbing material.

13. The display device of claim 1, wherein at least one selected from the adhesive layer, the first heat dissipation layer, the cushion layer and the second heat dissipation layer comprises a light-blocking material.

14. The display device of claim 13, wherein
the light-blocking material comprises a carbon-based material, a black pigment or a black dye,
wherein the carbon-based material includes graphene or graphite.

15. The display device of claim 1, wherein the adhesive layer further comprises a foaming agent or elastic hollow particles.

16. The display device of claim 1, wherein the second heat dissipation layer comprises:
a first heat dissipation part which, on a plane, overlaps a portion of the cushion layer; and
a second heat dissipation part which, on the plane, overlaps a remaining portion of the cushion layer, and includes a material different from a material of the first heat dissipation part.

17. An electronic device comprising a display device, wherein the display device comprises:
a display panel which displays an image; and
a functional layer disposed below the display panel,
wherein the functional layer includes:
an adhesive layer disposed below the display panel;
a first heat dissipation layer directly disposed below the adhesive layer;
a cushion layer directly disposed below the first heat dissipation layer; and a second heat dissipation layer directly disposed below the cushion layer, wherein the adhesive layer is an uppermost layer of the functional layer, and the first heat dissipation layer is disposed between the adhesive layer and the cushion layer, and wherein the cushion layer comprises:

skin layers adjacent to the first heat dissipation layer and the second heat dissipation layer; and a central layer disposed between the skin layers, wherein pores are defined in the central layer.

18. The electronic device of claim 17, wherein the cushion layer comprises at least one selected from a heat-conducting metal, a carbon-based heat-dissipating material, and a ceramic heat-dissipating material, and a combination thereof.

19. A functional layer comprising:

an adhesive layer including protrusion patterns;

a first heat dissipation layer disposed below the adhesive layer;

a cushion layer disposed below the first heat dissipation layer, and including heat-conducting particles; and a second heat dissipation layer disposed below the cushion layer, wherein the adhesive layer is an uppermost layer of the functional layer, and the first heat dissipation layer is disposed between the adhesive layer and the cushion layer, and wherein the cushion layer comprises:

skin layers adjacent to the first heat dissipation layer and the second heat dissipation layer; and a central layer disposed between the skin layers, wherein pores are defined in the central layer.

20. The functional layer of claim 19, wherein the adhesive layer further comprises an adhesive base adjacent to the first heat dissipation layer, and the protrusion patterns protrude from an upper portion of the adhesive base in a direction away from the first heat dissipation layer.

21. A method for manufacturing a display device, the method comprising:

preparing a display panel which displays an image; and forming a functional layer, and bonding the functional layer under the display panel, wherein the functional layer includes:

an adhesive layer bonded to a lower structure of the display panel;

a first heat dissipation layer disposed below the adhesive layer;

a cushion layer disposed below the first heat dissipation layer, and including heat-conducting particles; and a second heat dissipation layer disposed below the cushion layer, wherein the adhesive layer is an uppermost layer of the functional layer, and the first heat dissipation layer is disposed between the adhesive layer and the cushion layer, wherein the cushion layer comprises:

skin layers adjacent to the first heat dissipation layer and the second heat dissipation layer; and a central layer disposed between the skin layers, wherein pores are defined in the central layer, and wherein the forming the functional layer includes foaming the cushion layer using, as a base layer, at least one selected from the first heat dissipation layer and the second heat dissipation layer.

22. The method of claim 21, wherein in the forming the cushion layer, the cushion layer is formed to contact each of the first heat dissipation layer and the second heat dissipation layer, and the forming the functional layer further comprises, after the foaming the cushion layer, attaching the adhesive layer on the first heat dissipation layer.

23. The method of claim 21, wherein in the forming the cushion layer, the cushion layer is formed to contact one of the first heat dissipation layer and the second heat dissipation layer, and the forming the functional layer further comprises, after the foaming the cushion layer, attaching the other of the first heat dissipation layer and the second heat dissipation layer to the cushion layer.

* * * * *